United States Patent
Kim et al.

(10) Patent No.: US 6,492,701 B1
(45) Date of Patent: Dec. 10, 2002

(54) SEMICONDUCTOR DEVICE HAVING ANTI-REFLECTIVE CAP AND SPACER, METHOD OF MANUFACTURING THE SAME, AND METHOD OF MANUFACTURING PHOTORESIST PATTERN USING THE SAME

(75) Inventors: In-sung Kim, Seoul (KR); Jung-hyeon Lee, Suwon (KR); Han-ku Cho, Sungnam (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 09/324,072

(22) Filed: Jun. 1, 1999

(30) Foreign Application Priority Data

Jun. 29, 1998 (KR) .............................................. 98-24994

(51) Int. Cl.[7] ........................................ H01L 31/0232
(52) U.S. Cl. ...................... 257/437; 257/431; 257/432; 257/434; 257/435
(58) Field of Search ................................ 257/437, 431, 257/432, 434, 435

(56) References Cited

U.S. PATENT DOCUMENTS

| | | | | |
|---|---|---|---|---|
| 5,459,354 A | * | 10/1995 | Hara | 257/754 |
| 5,483,095 A | * | 1/1996 | Kagawa et al. | 257/431 |
| 5,486,719 A | * | 1/1996 | Sugiura et al. | 257/641 |
| 5,488,246 A | * | 1/1996 | Hayashide et al. | 257/336 |
| 5,600,165 A | * | 2/1997 | Tsukamoto et al. | 257/323 |
| 5,665,643 A | * | 9/1997 | Shin | 438/763 |
| 5,801,399 A | * | 9/1998 | Hattori et al. | 257/69 |
| 5,831,321 A | * | 11/1998 | Nagayama | 257/412 |
| 5,841,179 A | * | 11/1998 | Pramanick et al. | 257/437 |
| 5,872,385 A | * | 2/1999 | Taft et al. | 257/437 |
| 5,918,147 A | * | 6/1999 | Filipiak et al. | 438/636 |
| 5,925,932 A | * | 7/1999 | Tran et al. | 257/750 |
| 6,004,722 A | * | 12/1999 | Zhang et al. | 430/271.1 |
| 6,017,784 A | * | 1/2000 | Ohta et al. | 438/197 |
| 6,027,971 A | * | 2/2000 | Cho et al. | 438/257 |
| 6,040,613 A | * | 3/2000 | McTeer et al. | 257/437 |
| 6,043,547 A | * | 3/2000 | Hsia et al. | 257/437 |
| 6,071,653 A | * | 6/2000 | Lin | 430/5 |
| 6,133,618 A | * | 10/2000 | Steiner | 257/646 |

FOREIGN PATENT DOCUMENTS

| | | | | |
|---|---|---|---|---|
| EP | 585055 A1 | * | 2/1994 | ....... H01L/31/0216 |
| JP | 59132120 A | * | 7/1984 | ........... H01L/21/20 |
| JP | 07106308 A | * | 4/1995 | ....... H01L/21/3065 |

* cited by examiner

Primary Examiner—Allan R. Wilson
Assistant Examiner—Eugene Lee
(74) Attorney, Agent, or Firm—Cantor Colburn LLP

(57) ABSTRACT

A semiconductor device including an anti-reflective cap and spacer, a method of manufacturing the same, and a method of forming a photoresist pattern using the same are provided. The semiconductor device according to the present invention includes an anti-reflective cap and an anti-reflective spacer on an upper surface and side walls of a reflective pattern formed on the semiconductor substrate. Therefore, the deformation of the photoresist pattern by the light reflected from the reflective pattern is minimized during a photolithography process.

12 Claims, 7 Drawing Sheets

SEMICONDUCTOR DEVICE HAVING ANTI-REFLECTIVE CAP AND SPACER, METHOD OF MANUFACTURING THE SAME, AND METHOD OF MANUFACTURING PHOTORESIST PATTERN USING THE SAME

BACKGROUND OF THE INVENTION

1. Field of the Invention

The present invention relates to a semiconductor device and a method for manufacturing the same, and more particularly, to a semiconductor device having an anti-reflective cap and a spacer, a method of manufacturing the same, and a method of manufacturing a photoresist pattern using the same.

2. Description of the Related Art

A highly integrated semiconductor device is formed using highly reflective materials such as polycrystalline silicon, aluminum, or metal silicide. When a photoresist film is formed on the highly reflective material layers, incident light is reflected from the highly reflective material onto the photoresist film during an exposure process to form a photoresist pattern. As a result, a deformed photoresist pattern is obtained.

Such a problem becomes more serious in the exposure process in which an exposure source emitting a short wavelength of 248 nm or less is used for forming a pattern according to a sub-micron design rule. In particular, when a pattern having a large step difference is formed of a reflective material, the density of the light reflected from the edge of a reflective material pattern increases more, and the deformation of the photoresist pattern is also increased.

In order to solve such a problem, there is a method of forming an anti-reflective film under or on the photoresist film before performing a photolithography process. In the method, the anti-reflective film must be formed whenever the photolithography process is performed and removed after the patterning is completed. Therefore, the process of manufacturing the semiconductor device becomes more complicated.

SUMMARY OF THE INVENTION

To solve the above problems, it is an objective of the present invention to provide a semiconductor device of a new structure by which it is possible to effectively prevent light from being reflected from a reflective pattern.

It is another objective of the present invention to provide a method suitable for manufacturing the semiconductor device of the new structure.

It is still another objective of the present invention to provide a method of manufacturing a fine photoresist pattern more simply by effectively preventing light from being reflected from a reflective pattern using the semiconductor device.

To achieve the first objective, there is provided a semiconductor device, comprising an anti-reflective cap formed on an upper surface of the reflective pattern formed on a semiconductor substrate and an anti-reflective spacer formed on side walls of the reflective pattern formed on the semiconductor substrate.

The anti-reflective cap preferably functions as an interference anti-reflective film which causes the light reflected from the surface of the reflective pattern to destructively interfere with the light reflected from the surface of the anti-reflective cap, thus reducing a reflectance to not more than 20% and is formed of a material having a refractive index of not less than 1.0 under incident light having a wavelength of not more than 365 nm.

The anti-reflective spacer preferably functions as an absorbent anti-reflective film which absorbs the light reflected from the surface of the reflective pattern and the surface of the substrate, thus reducing a reflectance to not more than 20% and is formed of a material having a refractive index of not less than 1.0 and an extinction coefficient of not less than 0.05 under incident light having a wavelength of not more than 365 nm.

In a method of manufacturing a semiconductor device according to the present invention for achieving the second objective, a stacked structure comprised of a reflective pattern and an anti-reflective cap is formed on the semiconductor substrate after providing a semiconductor substrate. Then, an anti-reflective spacer is formed on side walls of the stacked structure.

The formation of the stacked structure proceeds as follows. After forming a reflective material film on the semiconductor substrate, an anti-reflective film is formed on the reflective material film. Then, after forming a photoresist film on the anti-reflective film, a photoresist pattern is formed by exposing and developing the photoresist film. Finally, a stacked structure comprised of the anti-reflective cap and the reflective pattern is completed by etching the anti-reflective film and the reflective material film using the photoresist pattern as an etching mask.

The anti-reflective spacer is formed by forming an anti-reflective film on the entire surface of the resultant structure on which the stacked structure is formed and anisotropically etching the anti-reflective film.

In a method of manufacturing a photoresist pattern for achieving the third objective, after providing a semiconductor substrate, a stacked structure comprised of a reflective pattern and an anti-reflective cap is formed on the semiconductor substrate. An anti-reflective spacer is formed on the side walls of the stacked structure. A first interlayer dielectric film is formed on the entire surface of the semiconductor substrate on which the anti-reflective spacer is formed. A photoresist film is formed on the first interlayer dielectric film. A photoresist pattern exposing the first interlayer dielectric film area under which the reflective pattern is buried, is formed by exposing and developing the photoresist film.

After forming a contact hole exposing a partner some of the stacked structure and a partner of the anti-reflective film spacer and the semiconductor substrate, the photoresist pattern is removed. The contact hole may be formed by etching the first interlayer dielectric film using the photoresist pattern as an etching mask.

After forming the contact hole, a conductive film pattern filling the contact hole is formed. A second interlayer dielectric film is formed on the entire surface of the resultant structure on which the conductive film pattern is formed. After forming a photoresist film on the second interlayer dielectric film, a photoresist pattern exposing the second interlayer dielectric film area under which the conductive film pattern, the stacked structure, and the anti-reflective film spacer are buried, is formed by exposing and developing the photoresist film.

Preferably, after forming the second interlayer dielectric film, of an anti-reflective film may be formed on the second interlayer dielectric film.

When the photoresist pattern is formed using the semiconductor device having the anti-reflective cap and the spacer according to the present invention, the deformation of the photoresist pattern by the light reflected from the reflective pattern is minimized. Also, it is possible to simplify the process of forming the photoresist pattern.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
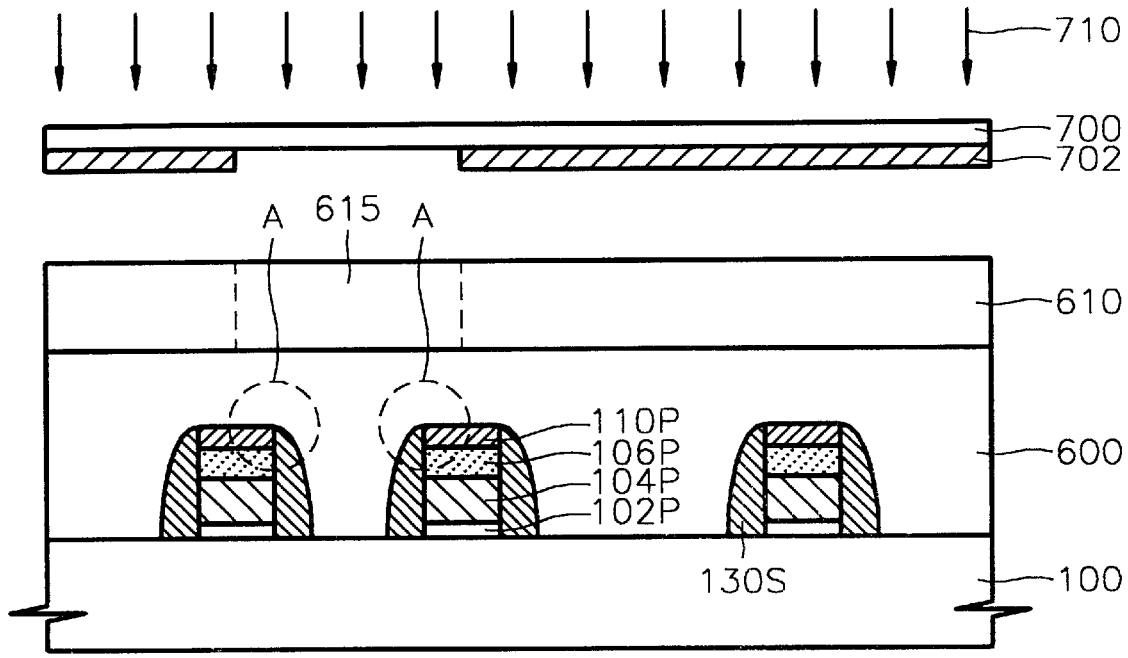
FIG. 1 is a sectional view of a semiconductor device having an anti-reflective cap and a spacer on the upper surface and the side surface of a reflective pattern according to an embodiment of the present invention.

The present invention will now be described in detail by describing preferred embodiments of the present invention with reference to the attached drawings. The present invention is not restricted to the above embodiments, and it is clearly understood that many variations are possible within the scope and spirit of the present invention by anyone skilled in the art. In the attached drawings, the thicknesses of various films and areas are exaggerated for clarity. When a film is described as being on the other film or a substrate, it can be directly on the other film or a substrate or an interlayer film can exist. The same reference numerals denote the same members.

Referring to FIG. 1, an oxide film pattern 102P, a conductive film pattern 104P, and a metal silicide film pattern 106P are sequentially stacked on a semiconductor substrate 100. The conductive film pattern 104P and the metal silicide film pattern 106P are reflective patterns. The conductive film pattern 104P is formed of a polysilicon film or a tungsten film. The metal silicide film pattern 106P is formed of a material such as a tungsten silicide film, a titanium silicide film, or a cobalt silicide film.

In FIG. 1, a gate electrode structure in which the conductive film pattern 104P and the metal silicide film pattern 106P are stacked is shown as the reflective pattern. However, the reflective pattern of the present invention can be a single layer. A pattern constructed of a highly reflective material, such as an aluminum film pattern, an aluminum alloy film pattern, or a tungsten film pattern, can be the reflective pattern of the present invention.

An anti-reflective cap 110P is formed on the reflective patterns 104P and 106P. An anti-reflective spacer 130S is formed on side walls of the reflective patterns 104P and 106P.

The anti-reflective cap 110P is used as the anti-reflective film during a photolithography process for forming a photoresist pattern which defines the reflective patterns 104P and 106P and is preferably patterned when the reflective pattern is patterned.

In particular, the anti-reflective cap 110P preferably functions as an interference anti-reflective film which causes the light reflected from the surfaces of the reflective patterns 104P and 106P to destructively interfere with the light reflected from the anti-reflective cap 110P, thus reducing the reflectance to not more than 20% in a subsequent photolithography process.

The reflectance is calculated by the following Equation.

$$R=|(r_{21}+r_{10}e^{-2ig l})/(1+r_{21}r^{10}e^{-2ig l})|^2$$

$$r_{12}=(N_1-N_2)/(N_1+N_2)$$

$$g=(2\pi/\lambda)N_1 t_1$$

wherein, R, $N_1$, $N_2$, A, and $t_1$ respectively represent a reflectance, the
refractive index of the anti-reflective cap, the refractive index of the reflective pattern, the wavelength of an exposure source, and the thickness of the anti-reflective cap.

Therefore, when the refractive index of the anti-reflective cap 110P and the refractive index of the reflective pattern upper layer 106P are known and the range of an allowable reflectance is defined, it is possible to obtain the appropriate thickness of the anti-reflective cap 110P.

It is preferable to minimize the reflectance by forming the anti-reflective cap 110P of a material having a refractive index $N_1$ of not less than 1.0 under the incident light having a wavelength of not more than 365 nm. Therefore, the anti-reflective cap 110P can be formed of an organic matter or an inorganic matter which satisfy the above refractive index. An inorganic anti-reflective material which is widely used as an anti-reflective film, such $SiO_xN_y$ or $GeO_xN_y$ preferably used as the anti-reflective cap 110P.

The anti-reflective spacer 130S can be formed thickly on the side walls of the reflective patterns 104P and 106P. Therefore, the anti-reflective spacer 130S can function as an absorbent anti-reflective film. In particular, the reflectance is preferably reduced to not more than 20% by absorbing the light reflected from the surfaces of the reflective patterns 104P and 106P and the surface of the substrate 100.

Therefore, the anti-reflective spacer 130S is preferably formed of a material having a refractive index of not less than 1.0 and an extinction coefficient of not less than 0.05 under the incident light having the wavelength of not more than 365 nm, and thus minimizing the reflectance. Therefore, any organic matter or inorganic matter which satisfies the above conditions can be used as the anti-reflective spacer 130S. The anti-reflective spacer 130S is preferably formed of the same material as the anti-reflective cap 110P, to simplify the process. Therefore, the anti-reflective spacer is preferably formed of $SiO_xN_y$ or $GeO_xN_y$.

The semiconductor device according to the present invention includes the anti-reflective cap 110P and the anti-reflective spacer 130S on the upper surface and the side walls of the reflective patterns 104P and 106P. Accordingly, it is possible to prevent the photoresist pattern from being deformed by the light reflected from the reflective pattern during a subsequent photolithography process for completing the semiconductor device. Since it is not necessary to form and remove an anti-reflective film for each of the many photolithography processes required for completing the semiconductor device, it is possible to easily complete the semiconductor device using a simplified process.

Figure 2:
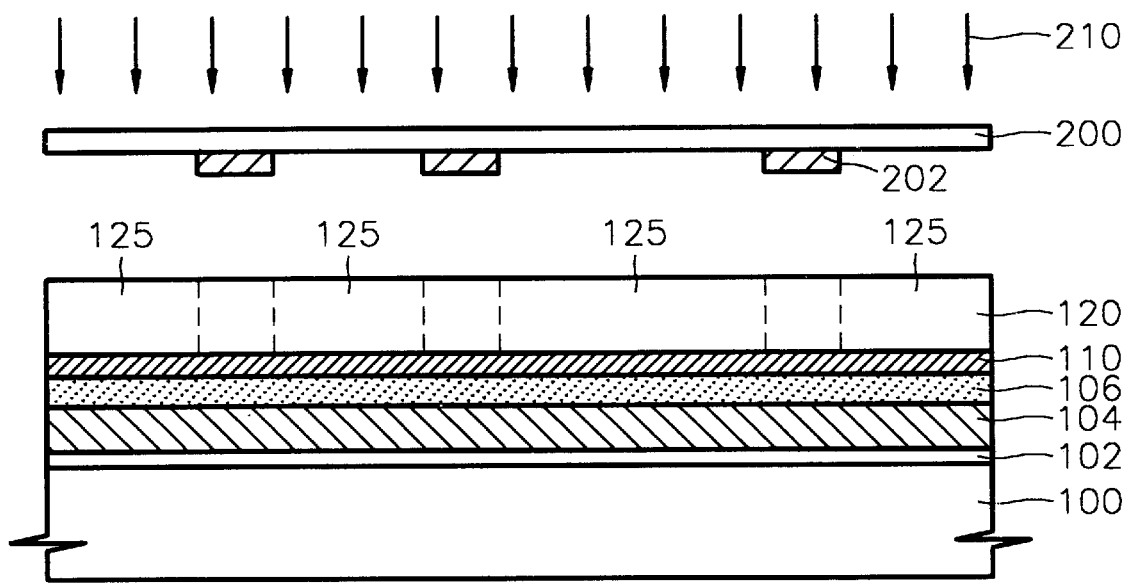
FIGS. 2 through 6 are sectional views of intermediate structures in a process for manufacturing the semiconductor device shown in FIG. 1.

In accordance with the present invention, a method of manufacturing a semiconductor device including anti-reflective cap 110P and anti-reflective spacer 130S is presented. Referring to FIG. 2, an oxide film 102, a conductive film 104, and a metal silicide film 106 are sequentially stacked on a semiconductor substrate 100. A first anti-reflective film 110 is formed on the metal silicide film 106. A photoresist film 120 is coated on the first anti-reflective film 110 using a spin-coating method.

At this time, the formation of the oxide film 102 is optional. A reflective material film can be formed of two layers, such as the conductive film 104 and the metal silicide film 106, or only one layer, such as the conductive film or the metal silicide film 106.

A predetermined area 125 of the photoresist film is exposed by irradiating incident light 210 having the wavelength of not more than 365 nm through a mask 200 on which a predetermined pattern 202 is formed.

At this time, the first anti-reflective film 110 prevents an undesirable effect such as a standing wave caused by the incident light 210 reflected from the metal silicide film 106 or the conductive film 104. It is preferable that the first anti-reflective film 110 destructively interferes the light reflected from the metal silicide film 106 or the conductive film 104 with the light reflected from the first anti-reflective film 110, thereby reducing the reflectance to not more than 20%. Therefore, the first anti-reflective film is formed of a material having a refractive index $N_1$ of not less than 1.0 under the incident light 210 having the wavelength of not more than 365 nm.

Figure 3:
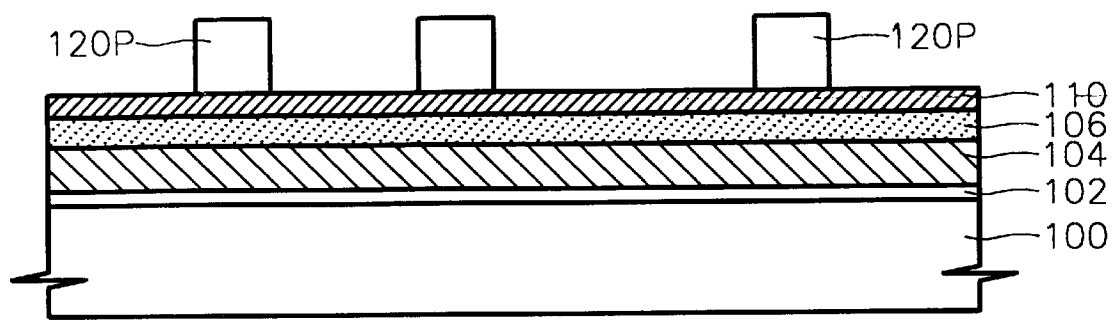

Referring to FIG. 3, a photoresist pattern 120P which defines the reflective pattern is formed by developing the exposed photoresist film area 125 using an appropriate developer.

Figure 4:
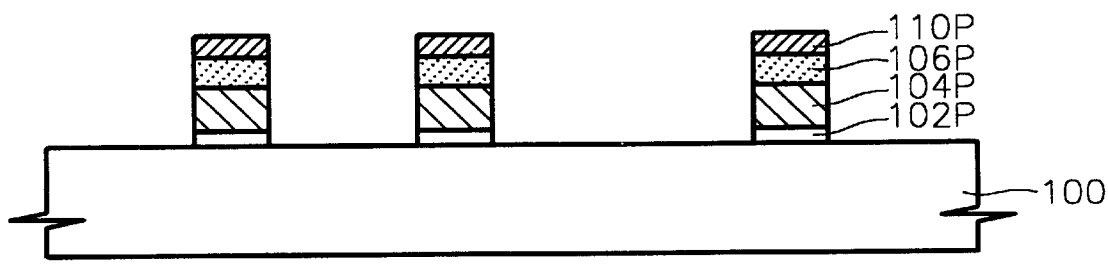

As shown in FIG. 4, a reflective pattern comprised of the anti-reflective cap 110P, the metal silicide film pattern 106P and the conductive film pattern 104P, and the oxide film pattern 102P, are formed by sequentially etching the first anti-reflective film 110, the metal silicide film 106, the conductive film 104, and the oxide film 102 using the photoresist pattern 120P as an etching mask. Then, the photoresist pattern 120P is removed.

At this time, after removing the photoresist pattern 120P, the anti-reflective cap 110P remains, unlike in conventional technology. This allows the anti-reflective cap 110P to play the role of the anti-reflective film in the subsequent process.

Figure 5:
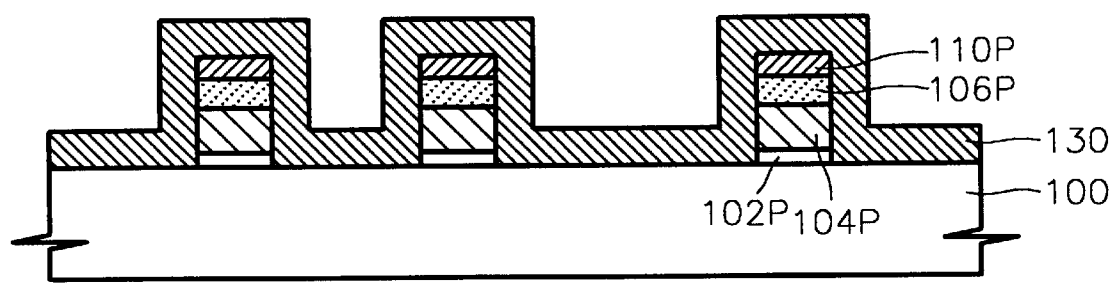

Referring to FIG. 5, a second anti-reflective film 130 is formed on the entire surface of the semiconductor substrate on which the reflective pattern comprised of the anti-reflective cap 110P, the metal silicide film pattern 106P and the conductive film pattern 104P, and the oxide film pattern 102P, are formed.

The second anti-reflective film 130 is formed of a material having a refractive index of not less than 1.0 and an extinction coefficient of not less than 0.05 under the incident light having a wavelength of not more than 365 nm.

Figure 6:
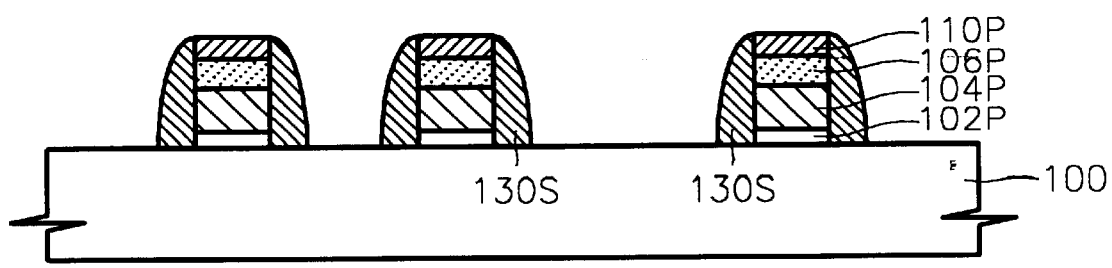

As shown in FIG. 6, the anti-reflective spacer 130S is formed on the side walls of the reflective patterns 106P and 104P by anisotropically etching the second anti-reflective film 130 formed on the entire surface of the substrate 100.

The anti-reflective spacer 130S is preferably formed on the side walls of the reflective patterns 104P and 106P to have a thickness by which it is possible to absorb the light reflected from the surfaces of the reflective patterns 104P and 106P and the surface of the substrate 100, and to reduce the reflectance to not more than 20%.

A method of forming a photoresist pattern using the semiconductor device according to the present invention shown in FIG. 1 will be described in greater detail as follows.

FIRST EMBODIMENT

Figure 7:
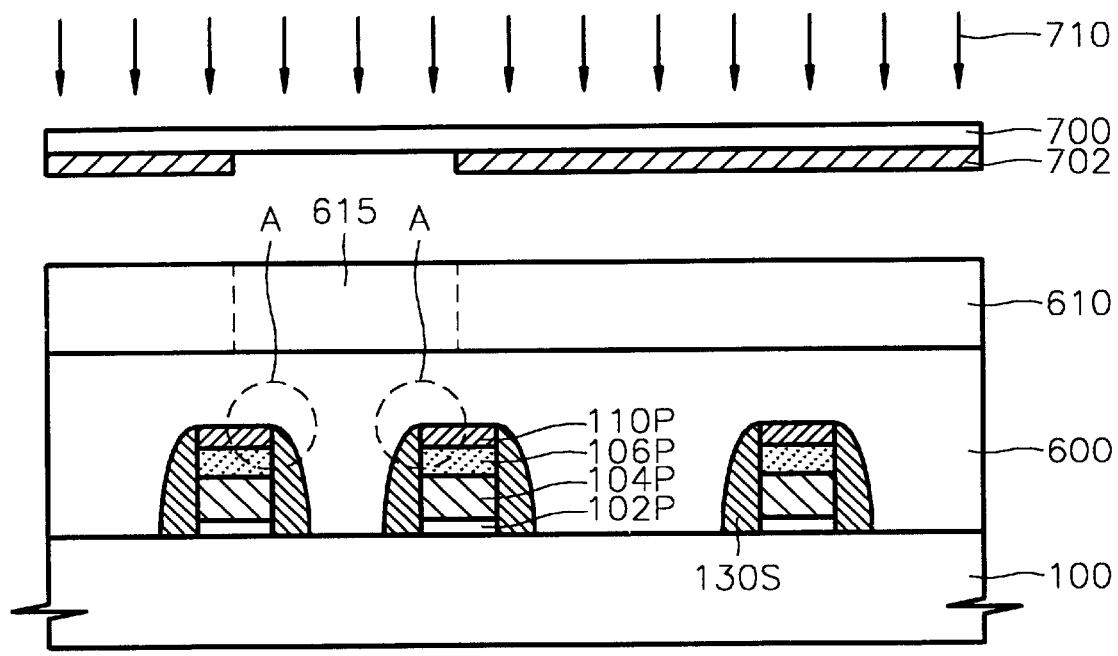
FIGS. 7 through 10 are sectional views of intermediate structures in a process for describing a method of forming a photoresist pattern according to a first embodiment of the present invention.

Referring to FIG. 7, a first interlayer dielectric film 600 is formed on the entire surface of the semiconductor substrate 100 having the anti-reflective cap 110P on the reflective patterns 104P and 106P and the anti-reflective spacer 130S on the side walls of the reflective patterns 104P and 106P. A photoresist film 610 is formed on the first interlayer dielectric film 600.

A predetermined area 615 of the photoresist film 610 is exposed by irradiating incident light 710 of a wavelength of not more than 365 nm through a mask 700 on which a predetermined pattern 702 is formed.

Since the anti-reflective cap 110P and the anti-reflective spacer 130S are formed on the upper surface and the side walls of the reflective patterns 104P and 106P, the reflectance which corresponds to percentage of incident light 710 reflected back to the photoresist pattern from the edge A of the reflective patterns 104P and 106P during exposure is minimized. Therefore, a process of forming the anti-reflective film between the first interlayer dielectric film 600 and the photoresist film 610 is not necessary.

Figure 8:
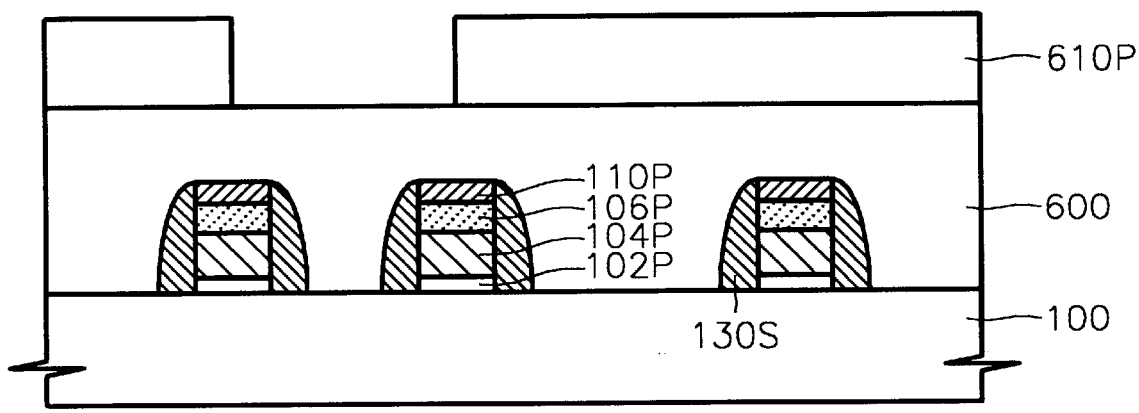

As shown in FIG. 8, a photoresist pattern 610P which exposes some area of the first interlayer dielectric film 600 is formed by developing the exposed photoresist area 615.

Figure 9:
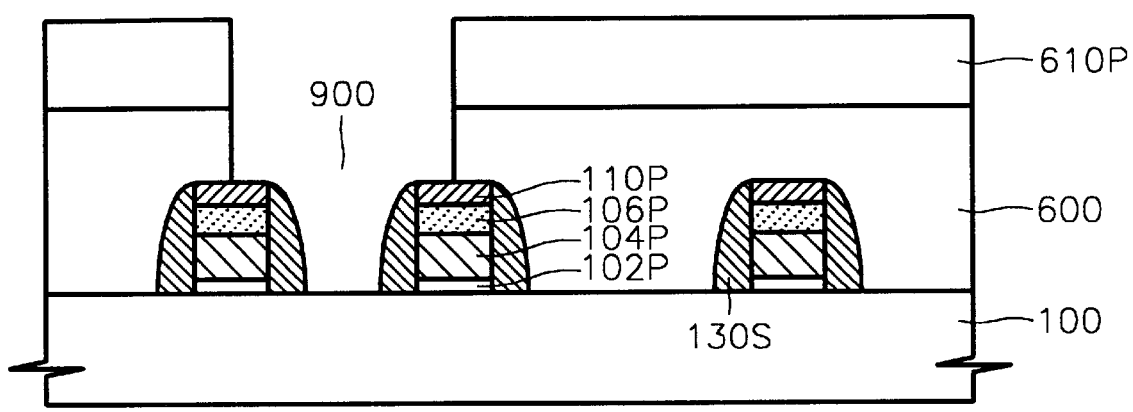

Referring to FIG. 9, a contact hole 900 which exposes some area of the anti-reflective cap 110P and some area of the anti-reflective spacer 130S and the substrate 100 is formed by etching the first interlayer dielectric film 600 using the photoresist pattern 610P as the etching mask.

Figure 10:
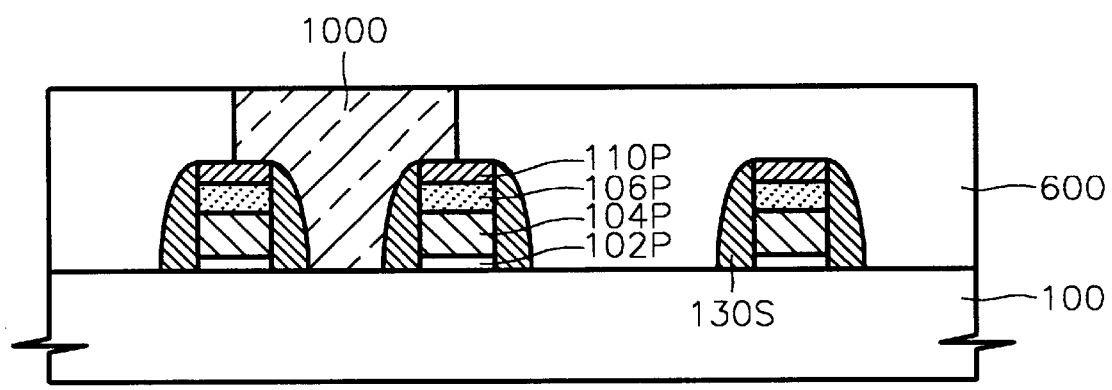

Finally, as shown in FIG. 10, a pad 1000 contacting the semiconductor substrate 100 is formed by filling the contact hole 900 with a conductive film and planarizing the resultant structure by etch-back or chemical mechanical polishing.

In the present embodiment, the photoresist pattern 610P defines the contact hole 900 in which the pad 1000 contacting the semiconductor substrate 100 is to be formed, but does not necessarily define only the contact hole. Namely, this first embodiment can be applied to every process of manufacturing a photoresist pattern in which the uniformity of the photoresist pattern is affected by light reflected from the upper surface and the side walls of the reflective pattern and changes the line width of the photoresist pattern during the exposure process.

According to the first embodiment, the anti-reflective cap 110P and the anti-reflective spacer 130S are formed on the upper surface and the side walls of the reflective patterns 104P and 106P and reduce the amount of incident light reflected from the reflective patterns 104P and 106P during the exposure process. Therefore, it is possible to improve the uniformity of the photoresist pattern. In the conventional technology, an anti-reflective film is formed whenever a new photoresist film is formed, and the anti-reflective film is removed after completing the photolithography process. In the present invention, it is not necessary to form a new anti-reflective film. Accordingly, the process is simplified.

SECOND EMBODIMENT

Figure 11:
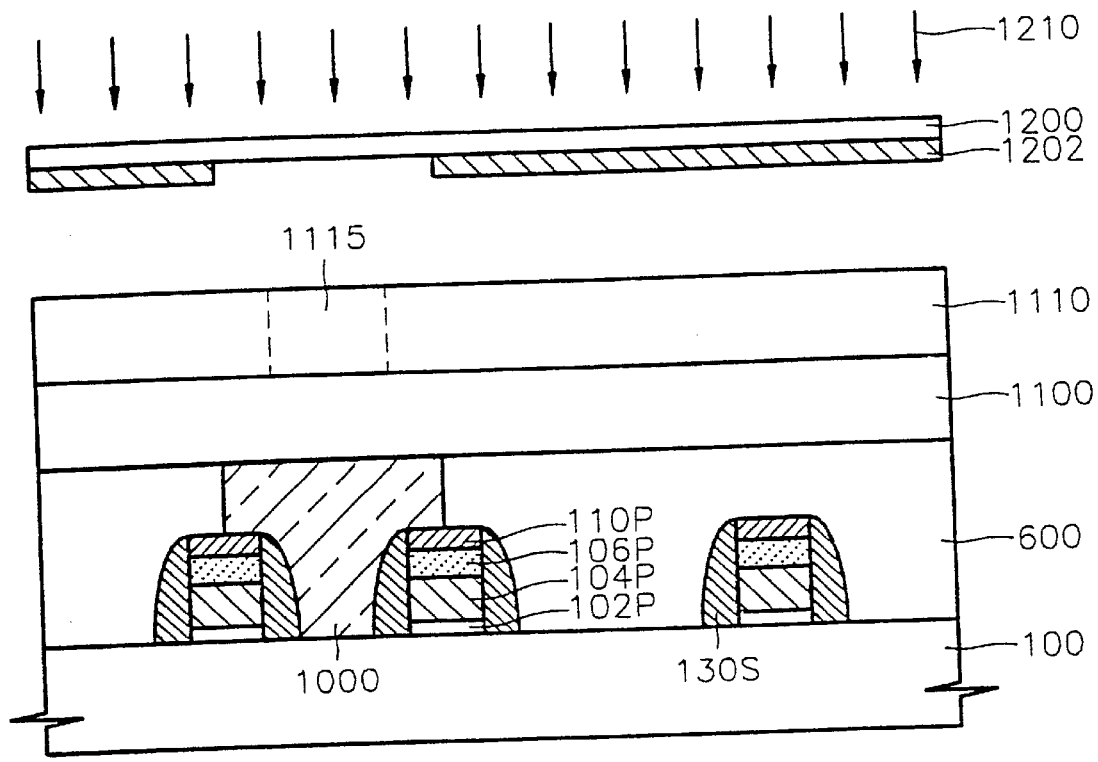
FIGS. 11 through 13 are sectional views of intermediate structures in a process for describing a method of forming a photoresist pattern according to a second embodiment of the present invention.

Referring to FIG. 11, a second interlayer dielectric film 1100 and a photoresist film 1110 are sequentially formed on the first interlayer dielectric film 600 in which the pad 1000 is formed.

Then, a predetermined area 1115 of the photoresist film 1110 is exposed by irradiating incident light 1210 of not more than 365 nm through a mask 1200 on which a predetermined pattern 1202 is formed.

As shown in the first embodiment, it is possible to minimize the amount of light reflected from the upper surfaces, side walls, and in particular, the edges, of the reflective patterns 104P and 106P.

Figure 12:
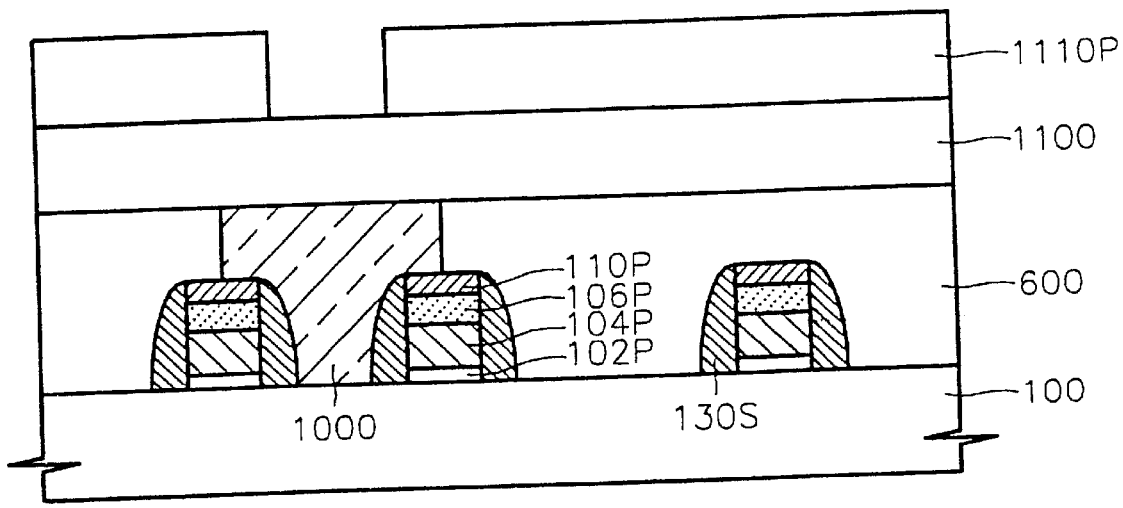

As shown in FIG. 12, the photoresist pattern 1110P is formed by developing the exposed area 1115 of the photoresist film.

Figure 13:
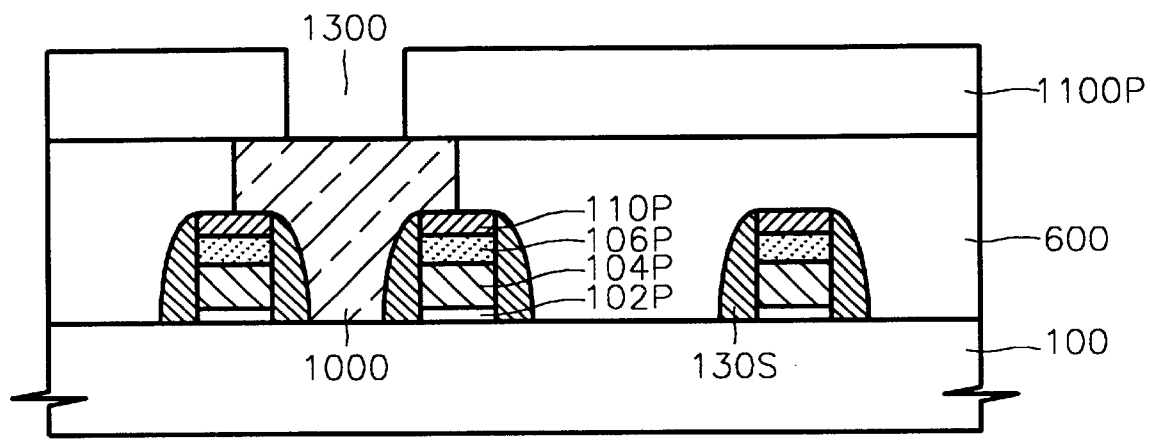

As shown in FIG. 13, the photoresist pattern 1110P is removed after forming the second interlayer dielectric film pattern 1100P by etching the second interlayer dielectric film 1100.

The second interlayer dielectric film pattern 1100P defines an engraved pattern for forming a bit line when the pad 1000 is for contacting the bit line. The second interlayer dielectric film pattern 1100P can also define a via hole 1300 contacting the pad 1000.

THIRD EMBODIMENT

Figure 14:
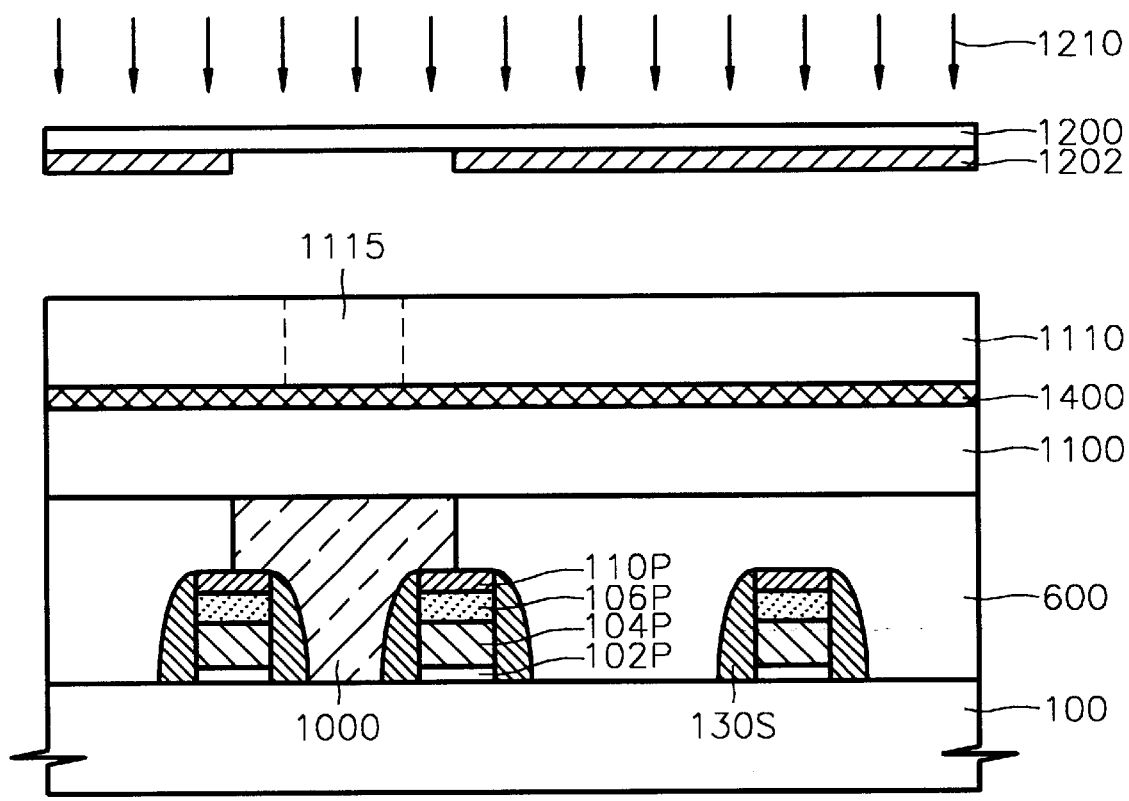
FIG. 14 is a sectional view of an intermediate structure in a process for describing a method of forming a photoresist pattern according to a third embodiment of the present invention.

Referring to FIG. 14, a third embodiment is different from the second embodiment only in that a third anti-reflective film 1400 is further formed before forming the photoresist film 1110. The other processes are the same as those of the second embodiment.

The third anti-reflective film 1400 is formed to reinforce an anti-reflection functions of the anti-reflective cap 110P and the anti-reflective spacer 130S when the light reflected from the pad 1000, as well as the light reflected from the reflective patterns 104P and 106P and also from the substrate between the anti-reflective spacers 130S, affects the uniformity of the photoresist pattern.

Since the third anti-reflective film 1400 is formed as thin as possible in order to be removed easily after completing the process of forming the photoresist pattern 1110P, the third anti-reflective film 1400 functions as an interference anti-reflective film.

Therefore, in this case, the thickness of the third anti-reflective film 1400 is determined by calculating the total thickness required for reducing the reflectance caused by the reflective pad 1000 and substrate between the anti-reflective spacers 130S which are not capped with the anti-reflective cap 110P within a desired range.

FOURTH EMBODIMENT

Figure 15:
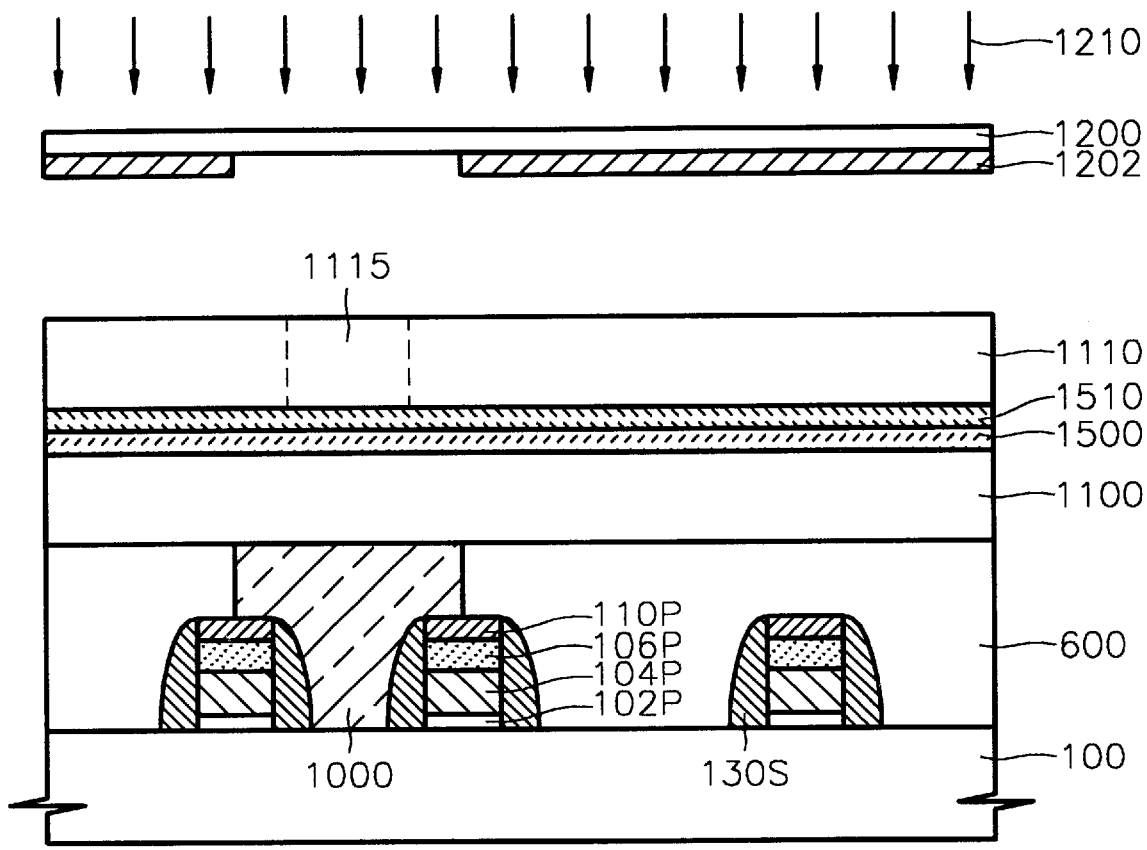
FIG. 15 is a sectional view of an intermediate structure in a process for describing a method of forming a photoresist pattern according to a fourth embodiment of the present invention.

Referring to FIG. 15, a fourth embodiment is different from the third embodiment in that the third anti-reflective film 1400 is formed to a double film, comprised of an absorbent anti-reflective film 1500 and an interference anti-reflective film 1510, to thereby enforcing anti-reflective effects.

The semiconductor device according to the present invention includes the anti-reflective cap and the anti-reflective spacer on the upper surface and the side walls of the reflective pattern. Therefore, it is possible to minimize the reflectance which corresponds to percentage of light reflected from the reflective pattern during the subsequent photolithography process for completing the semiconductor device. This prevents the photoresist pattern from being deformed by the reflected light. Since it is not necessary to form and remove the anti-reflective film each time a photolithography process is required, it is possible to easily complete the semiconductor device.

What is claimed is:

1. A semiconductor device, comprising:

a semiconductor substrate;

a reflective pattern formed on the semiconductor substrate;

an anti-reflective cap formed on the reflective pattern, for reducing reflection of light used for a photolithography process by interfering first light reflected from the reflective pattern with second light reflected from the anti-reflective cap, wherein the anti-reflective cap has a selected thickness and a selected refractive index sufficient to provide destructive interference between the first and second lights; and an anti-reflective spacer formed on side walls of the reflective pattern, for reducing reflection of the light used for a photolithography process by absorbing the first light reflected from the reflective pattern, wherein the anti-reflective spacer has a selected thickness and a selected extinction coefficient sufficient to absorb the first light, wherein the semiconductor device further comprises a conductive film formed in contact with the semiconductor substrate, and an anti-reflective layer formed above the conductive film, the anti-reflective cap and the anti-reflective spacer, for reducing light reflected from the conductive film.

2. The semiconductor device of claim 1, wherein the anti-reflective cap is formed of $GeO_xN_y$ or $SiO_xN_y$.

3. The semiconductor device of claim 1, wherein the anti-reflective spacer reduces a reflectance of the first light reflected from the reflective pattern to not more than 20%.

4. The semiconductor device of claim 1, wherein the selected extinction coefficient of the anti-reflective spacer is equal to or higher than about 0.05 when the light used for a photolithography process has a wavelength equal to or less than about 365 nm.

5. The semiconductor device of claim 1, wherein the anti-reflective cap is formed by simultaneously patterning the anti-reflective cap with the reflective pattern.

6. The semiconductor device of claim 4, wherein the anti-reflective spacer further absorbs light reflected from the semiconductor substrate.

7. The semiconductor device of claim 1, wherein the selected refractive index of the anti-reflective cap is equal to or higher than about 1.0 when the light used for a photolithography process has a wavelength equal to or less than about 365 nm.

8. The semiconductor device of claim 5, wherein the anti-reflective spacer has a selected refractive index equal to or higher than about 1.0 when the light used for a photolithography process has a wavelength equal to or less than about 365 nm.

9. The semiconductor device of claim 1, wherein the anti-reflective cap reduces reflectance of the first light reflected from the reflective pattern to not more than 20%.

10. The semiconductor device of claim 1, wherein the anti-reflective spacer is formed of $GeO_xN_y$ or $SiO_xN_y$.

11. The semiconductor device of claim 1, wherein the anti-reflective layer further reduces light reflected from the reflective pattern and the semiconductor substrate.

12. The semiconductor device of claim 11, wherein the anti-reflective layer includes:

a first anti-reflective film for interfering the light reflected from the conductive film, the reflective pattern and the semiconductor substrate with light reflected from the first anti-reflective film; and a second anti-reflective film for absorbing the light reflected from the conductive film, the reflective pattern and the semiconductor substrate.

* * * * *